United States Patent
Kusakawa et al.

(10) Patent No.: US 11,031,277 B2
(45) Date of Patent: Jun. 8, 2021

(54) PROCESSING APPARATUS

(71) Applicant: DISCO CORPORATION, Tokyo (JP)

(72) Inventors: Mayumi Kusakawa, Tokyo (JP); Yukiyasu Masuda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 181 days.

(21) Appl. No.: 16/555,030

(22) Filed: Aug. 29, 2019

(65) Prior Publication Data

US 2020/0083081 A1 Mar. 12, 2020

(30) Foreign Application Priority Data

Sep. 10, 2018 (JP) .............................. JP2018-168491

(51) Int. Cl.
| | |
|---|---|
| *H01L 21/687* | (2006.01) |
| *H01L 21/68* | (2006.01) |
| *H01L 21/67* | (2006.01) |
| *B23K 37/04* | (2006.01) |
| *B23K 26/03* | (2006.01) |
| *B23K 26/08* | (2014.01) |
| *H01L 21/304* | (2006.01) |
| *G01N 21/95* | (2006.01) |

(52) U.S. Cl.
CPC ...... *H01L 21/68735* (2013.01); *B23K 26/032* (2013.01); *B23K 26/0853* (2013.01); *B23K 37/04* (2013.01); *G01N 21/9503* (2013.01); *H01L 21/304* (2013.01); *H01L 21/67092* (2013.01); *H01L 21/67259* (2013.01); *H01L 21/681* (2013.01)

(58) Field of Classification Search
CPC . H01L 21/304; H01L 21/67; H01L 21/67092; H01L 21/67259; H01L 21/68; H01L 21/681; H01L 21/683; H01L 21/6831; H01L 21/6833; H01L 21/6836; H01L 21/68714; H01L 21/68735; H01L 22/10; H01L 22/12; H01L 22/20; H01L 22/30; G01N 21/9501; G01N 21/9503; B23K 26/02; B23K 26/03; B23K 26/032; B23K 26/0853; B23K 37/04
See application file for complete search history.

(56) References Cited

U.S. PATENT DOCUMENTS 5,194,743 A * 3/1993 Aoyama ............. G03F 7/70716
250/548
5,644,400 A * 7/1997 Mundt ................... G01B 11/08
356/150

(Continued)

FOREIGN PATENT DOCUMENTS

| JP | 2007019461 A | 1/2007 |
|---|---|---|
| JP | 2014060224 A | 4/2014 |

*Primary Examiner* — Eduardo A Rodela
(74) *Attorney, Agent, or Firm* — Greer Burns & Crain Ltd.

(57) ABSTRACT

A processing apparatus includes a holding table. The holding table includes a frustoconical portion and a wafer holding portion formed on the upper surface of the frustoconical portion for holding the wafer. Light is applied from a light emitting member to the side surface of the frustoconical portion and next reflected on the side surface of the frustoconical portion. The light reflected is applied to the outer circumference of the wafer held on the wafer holding portion of the holding table to thereby image the outer circumference of the wafer by an imaging unit.

3 Claims, 6 Drawing Sheets

(56) References Cited

U.S. PATENT DOCUMENTS

| | | | |
|---|---|---|---|
| 6,768,542 B2* | 7/2004 | Ise | G01N 21/9501 356/237.1 |
| 2005/0036671 A1* | 2/2005 | Watkins | G01N 21/9503 382/145 |
| 2007/0222977 A1* | 9/2007 | Hayashi | G01N 21/9506 356/237.2 |
| 2008/0088830 A1* | 4/2008 | Serikawa | G01N 21/958 356/237.2 |
| 2009/0086483 A1* | 4/2009 | Hahn | G01N 21/9503 362/235 |
| 2010/0295934 A1* | 11/2010 | Okamoto | G06T 3/4038 348/87 |
| 2011/0064297 A1* | 3/2011 | Sakaguchi | G01N 21/9503 382/141 |
| 2015/0198899 A1* | 7/2015 | Fukushi | G03F 7/70775 355/73 |
| 2017/0076969 A1* | 3/2017 | Shirono | H01L 21/6835 |
| 2019/0006220 A1* | 1/2019 | Chiu | H01L 21/67103 |

* cited by examiner

PROCESSING APPARATUS

BACKGROUND OF THE INVENTION

Field of the Invention

The present invention relates to a processing apparatus for determining the center of a circular wafer and performing predetermined processing.

Description of the Related Art

In a wafer having a device area and a peripheral marginal area surrounding the device area on the front side, a plurality of devices such as integrated circuits (ICs) and large-scale integrated circuits (LSIs) are formed in the device area so as to be separated from each other by a plurality of crossing division lines. The wafer thus having the plural devices is processed along the division lines by using a laser processing apparatus or a dicing apparatus, so that the wafer is divided into individual device chips respectively including the plural devices. These device chips are used in electrical equipment such as mobile phones and personal computers.

The laser processing apparatus includes a holding unit having a rotatable holding table for holding a wafer, the holding table being provided with a light emitting member (e.g., light emitting diode (LED)) for applying light to the outer circumference of the wafer, a moving mechanism for moving the holding unit in an X direction as a feeding direction and in a Y direction as an indexing direction, a laser beam applying unit applying a laser beam to the wafer held on the holding table, and a control unit performing laser processing to the division lines of the wafer, in which the light is applied from the light emitting member to the outer circumference of the wafer held on the holding unit, and the holding table is rotated stepwise by 90 degrees to image three peripheral edges on the outer circumference of the wafer. According to the coordinates of the three peripheral edges, the center of the wafer is detected and a deviation of the detected center of the wafer from the center of the holding table is determined by the control unit. In performing the processing in consideration of this deviation, the center position of the wafer is corrected by the control unit, and the division lines are laser-processed in consideration of this correction. Accordingly, the wafer can be processed with high accuracy by the laser processing apparatus (see Japanese Patent Laid-open No. 2014-060224, for example).

Further, there is a processing method for processing a wafer having a device area and a peripheral marginal area surrounding the device area on the front side, in which the back side of the wafer is ground in a central portion corresponding to the device area to thereby form a ring-shaped reinforcing portion on the back side of the wafer in a peripheral portion corresponding to the peripheral marginal area. Thereafter, various steps are performed to divide the wafer into individual device chips (see Japanese Patent Laid-open No. 2007-019461, for example). In dividing the wafer into individual device chips after forming the ring-shaped reinforcing portion, the ring-shaped reinforcing portion formed on the outer circumference may interfere with the processing and it is therefore cut away from the wafer. At this time, by using the method for detecting the center of the wafer as described in Japanese Patent Laid-open No. 2014-060224, the center coordinates of the wafer can be accurately determined and the ring-shaped reinforcing portion can be accurately cut away from the wafer according to the center coordinates determined above. Accordingly, the wafer can be well divided into the individual device chips.

SUMMARY OF THE INVENTION

According to the technique described in Japanese Patent Laid-open No. 2014-060224, the center coordinates of the wafer can be detected. However, the holding unit holding the wafer is composed of the holding table adapted to be suitably replaced according to the size of the wafer and a support member for detachably supporting the holding table. Accordingly, different holding tables corresponding to the different sizes of the wafer are prepared. In the case of using the holding table having a diameter smaller than the diameter of the upper surface of the support member on which the holding table is attached or from which it is detached, it is difficult to provide the LED for applying light to the outer circumference of the wafer on the holding table or on the support member. Further, the LED as the light emitting member must be provided on each holding table or on the support member, causing an increase in production cost.

It is therefore an object of the present invention to provide a processing apparatus which can determine the center of a circular wafer held on the holding table and then perform predetermined processing to the wafer without an increase in production cost.

In accordance with an aspect of the present invention, there is provided a processing apparatus comprising a holding unit holding a circular wafer; an imaging unit imaging the outer circumference of said wafer held by said holding unit from the upper side of said holding unit; and a light emitting member provided separately from said holding unit; said holding unit including a holding table for holding said wafer under suction in the condition where the outer circumference of the wafer projects from the outer circumference of the holding table, a support member for supporting the holding table, and driving means rotating the holding table; the holding table including a frustoconical portion and a wafer holding portion formed on the upper surface of the frustoconical portion for holding the wafer, the wafer holding portion having a diameter smaller than that of the wafer; the lower surface of the frustoconical portion having a diameter larger than that of the wafer held on the wafer holding portion, in which light is applied from the light emitting member to the side surface of the frustoconical portion and next reflected on the side surface of the frustoconical portion, and the light reflected is next applied to the outer circumference of the wafer held on the wafer holding portion of the holding table to thereby image the outer circumference of the wafer in the imaging unit.

Preferably, the holding unit further includes an auxiliary table formed along the outer circumference of the holding table for supporting the outer circumference of the wafer held on the holding table; the auxiliary table having at least three holes for passing the light reflected on the side surface of the frustoconical portion, so that the light passed through the holes is applied to the outer circumference of the wafer. Preferably, the side surface of the frustoconical portion is inclined at an angle of 45 degrees with respect to the lower surface of the frustoconical portion.

According to the present invention, even in the case that the diameter of the holding table is smaller than that of the support member, the outer circumference of the wafer can be well detected by reflecting the light on the side surface of the frustoconical portion of the holding table. Further, it is unnecessary to provide an LED on the holding table or on the support member, so that a production cost can be suppressed.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENT

Figure 1:
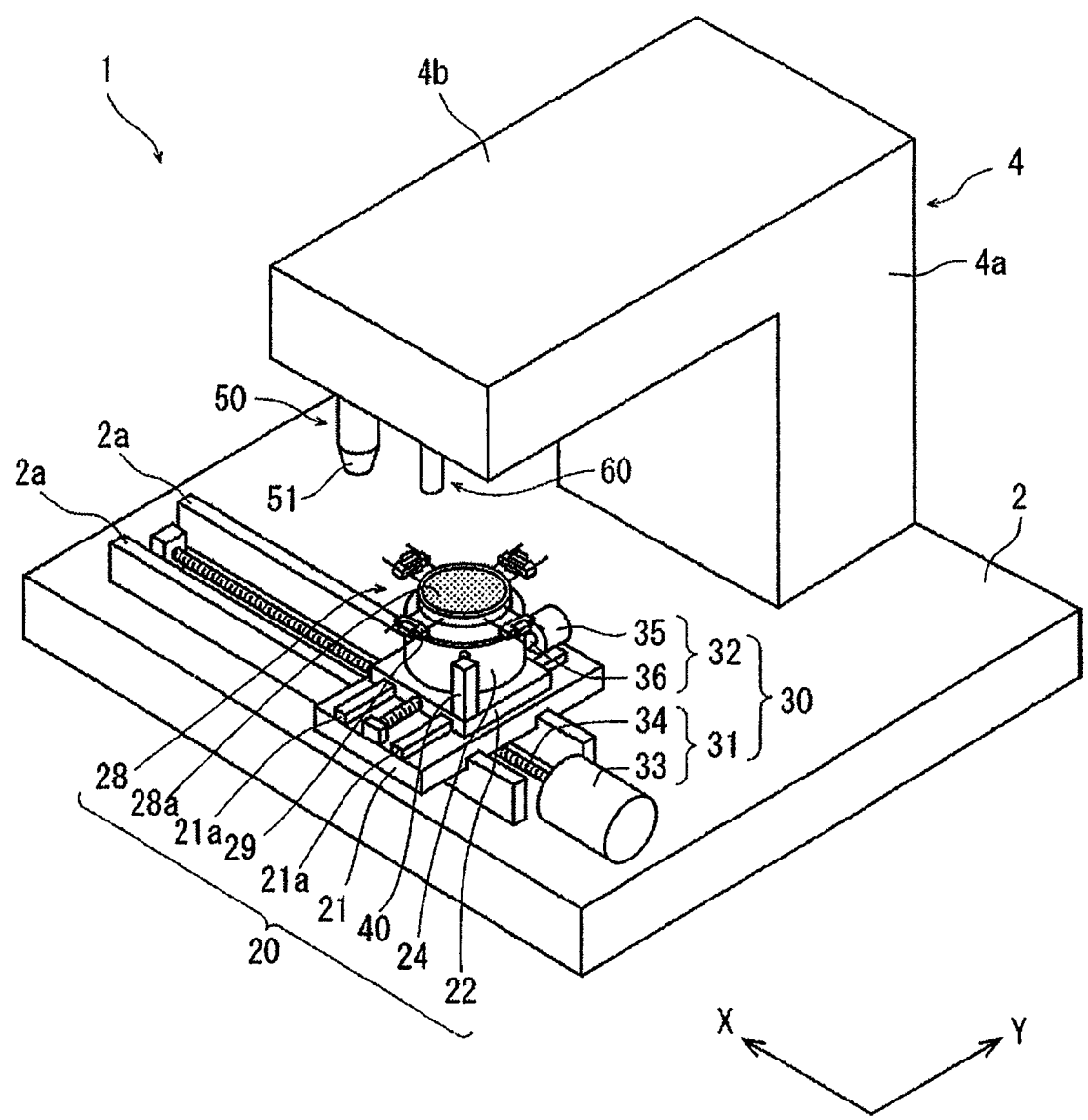
FIG. 1 is an overall perspective view of a laser processing apparatus according to a preferred embodiment of the present invention.

A processing apparatus according to a preferred embodiment of the present invention will now be described in detail with reference to the attached drawings. FIG. 1 is an overall perspective view of a laser processing apparatus 1 as an example of the processing apparatus according to this preferred embodiment. The laser processing apparatus includes a holding unit 20 for holding a circular workpiece (wafer), a moving mechanism 30 for moving the holding unit 20, and a laser beam applying unit 50 for applying a laser beam to the workpiece held by the holding unit 20.

The laser processing apparatus 1 further includes a base 2, and the holding unit 20 is movably mounted on the base 2. The holding unit 20 includes a rectangular X movable plate 21 mounted on the base 2 so as to be movable in the X direction depicted by an arrow X in FIG. 1, a rectangular Y movable plate 22 mounted on the X movable plate 21 so as to be movable in the Y direction depicted by an arrow Y in FIG. 1, the Y direction being perpendicular to the X direction in a horizontal plane, a cylindrical support member 24 fixed to the upper surface of the Y movable plate 22, a holding table 28 rotatably supported to the upper end of the support member 24 for holding the wafer under suction in such a manner that the outer circumference of the wafer projects from the outer circumference of the holding table 28, and a light emitting member 42 (see FIG. 4) provided on the Y movable plate 22 at a position adjacent to the support member 24 for applying light toward the holding table 28 from the outward direction.

The moving mechanism 30 includes an X moving mechanism 31 provided on the base 2 for moving the holding unit 20 in the X direction (feeding direction) and a Y moving mechanism 32 provided on the X Movable plate 21 for moving the holding unit 20 in the Y direction (indexing direction). The X moving mechanism 31 includes a pulse motor 33 and a ball screw 34 extending in the X direction and adapted to be rotated by the pulse motor 33, in which the ball screw 34 is threadedly engaged with the X movable plate 21. Accordingly, a rotary motion of the pulse motor 33 is converted into a linear motion by the ball screw 34, and this linear motion is transmitted to the X movable plate 21, so that the X movable plate 21 can be moved in the X direction along a pair of parallel guide rails 2a provided on the base 2. That is, the X movable plate 21 is slidably mounted on the guide rails 2a extending in the X direction. Similarly, the Y moving mechanism 32 includes a pulse motor 35 and a ball screw 36 extending in the Y direction and adapted to be rotated by the pulse motor 35, in which the ball screw 36 is threadedly engaged with the Y movable plate 22. Accordingly, a rotary motion of the pulse motor 35 is converted into a linear motion by the ball screw 36, and this linear motion is transmitted to the Y movable plate 22, so that the Y movable plate 22 can be moved in the Y direction along a pair of parallel guide rails 21a provided on the X movable plate 21. That is, the Y movable plate 22 is slidably mounted on the guide rails 21a extending in the Y direction.

An inverted L-shaped support member 4 is provided on the base 2 at a position behind the moving mechanism 30 in the Y direction. The Support member 4 is composed of a vertical portion 4a extending upward from the upper surface of the base 2 and a horizontal portion 4b extending horizontally from the upper end of the vertical portion 4a toward a position above the holding unit 20. The laser beam applying unit 50 has an optical system (not depicted) including a laser oscillator for generating a laser beam. This optical system is built in the horizontal portion 4b of the support member 4. The laser beam applying unit 50 further has focusing means 51 provided on the lower surface of the horizontal portion 4b at its front end portion. The focusing means 51 includes a focusing lens (not depicted) for focusing the laser beam generated from the laser oscillator. The laser beam generated from the laser oscillator of the laser beam applying unit 50 is passed through the optical system (not depicted) and then focused by the focusing means 51. The focused laser beam is applied to the workpiece held by the holding unit 20 so as to form a focused spot on the workpiece at a desired position.

An imaging unit 60 is also provided on the lower surface of the horizontal portion 4b at its front end portion at a position adjacent to the focusing means 51 in the X direction. The imaging unit 60 functions to image the workpiece held by the holding unit 20 from the position opposed to the holding unit 20, i.e., from the upper side of the holding unit 20. The imaging unit 60 includes an ordinary imaging device (charge-coupled device (CCD)) (not depicted) using visible light for imaging the workpiece and illuminating means (not depicted) for applying the visible light to the workpiece. The imaging unit 60 is connected to a control unit (not depicted). An image signal obtained by the imaging unit 60 is transmitted to the control unit. As a modification, the imaging unit 60 may include infrared light applying means applying infrared light to the workpiece and an infrared imaging device using the infrared light to image the workpiece, according to the kind of the workpiece.

The control unit (not depicted) is configured by a computer, which includes a central processing unit (CPU) for executing computation according to a control program, a read only memory (ROM) previously storing the control program, a random access memory (RAM) which can read and write for storing detection values, computation results, etc., an input interface, and an output interface. The control unit outputs control signals for operating the X moving mechanism 31, the Y moving mechanism 32, and the laser beam applying unit 50 according to the control program stored in the ROM. Further, the control unit stores an image signal transmitted from the imaging unit 60 and then records the X coordinate and the Y coordinate at an imaging position according to the image signal.

Figure 2:
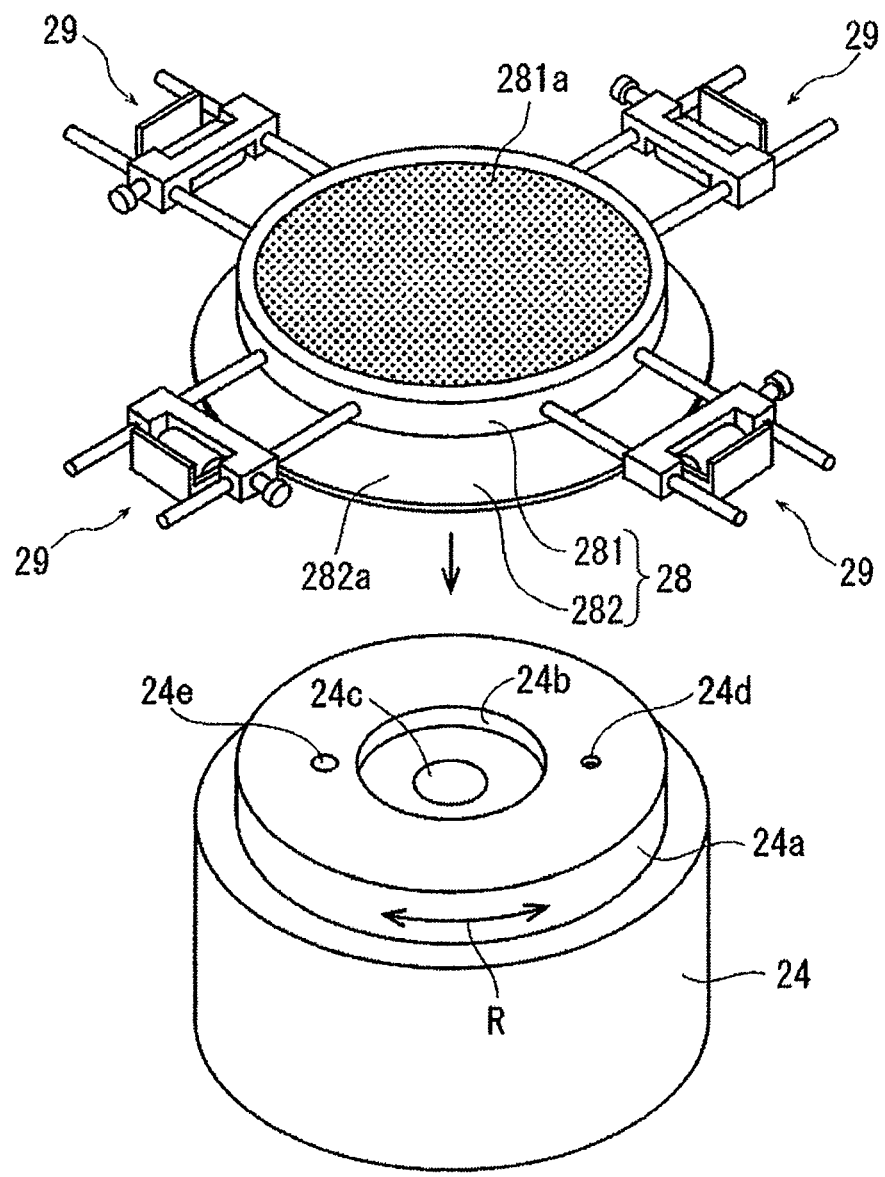
FIG. 2 is a perspective view of a holding table and a support member included in the laser processing apparatus depicted in FIG. 1 in the condition before mounting the holding table to the support member.
Figure 3:
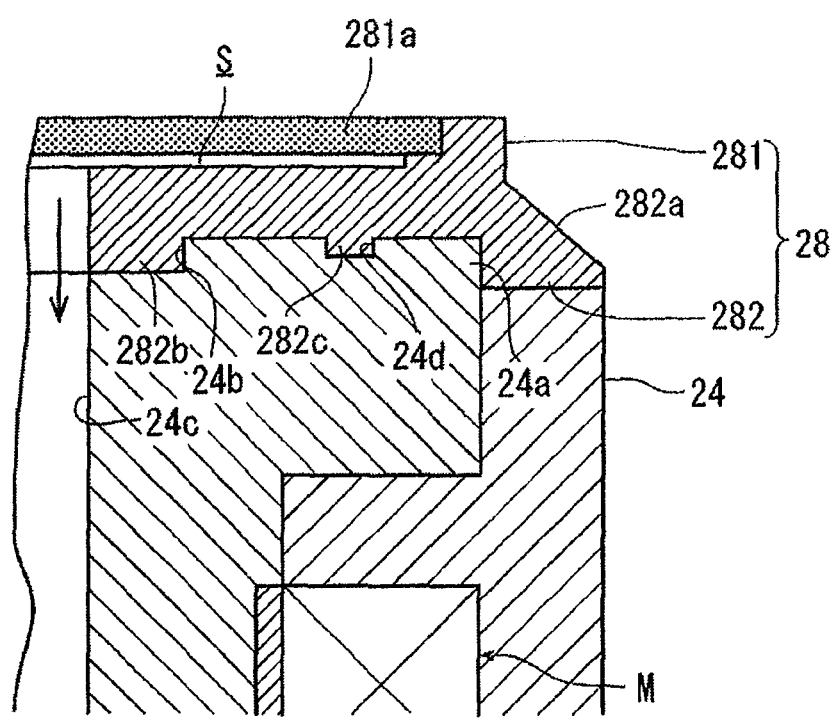
FIG. 3 is an enlarged sectional view of essential parts of the holding table and the support member in the condition where the holding table is mounted on the support member.

The support member 24 and the holding table 28 in this preferred embodiment will now be described in more detail with reference to FIGS. 2 and 3. The holding table 28 includes a wafer holding portion 281 having an upper surface for holding a wafer as the workpiece and a frustoconical portion 282 having an upper surface for supporting the wafer holding portion 281. As depicted in FIG. 3, the wafer holding portion 281 and the frustoconical portion 282 are integral with each other. The upper surface of the wafer holding portion 281 is provided with a circular vacuum chuck 281a formed of a porous material allowing the pass of air. The vacuum chuck 281a has a substantially horizontal upper surface. A plurality of (four in this preferred embodiment) clamps 29 are provided on the outer circumferential surface of the holding table 28 so as to be arranged at equal intervals. These clamps 29 function to fix an annular frame F (see FIG. 4) for supporting the wafer through a protective tape T (see FIG. 4) described hereinafter. The frustoconical portion 282 has a side surface 282a as an inclined surface, i.e., a conical surface. The side surface 282a is a mirror surface capable of well reflecting light. In this preferred embodiment, the side surface 282a is inclined at an angle of 45 degrees with respect to a horizontal plane, i.e., with respect to the lower surface (base) of the frustoconical portion 282.

The support member 24 for supporting the holding table 28 is provided with a rotating shaft 24a having an upper surface for mounting the holding table 28. A large-diameter recess 24b is formed at the center of the upper surface of the rotating shaft 24a. The large-diameter recess 24b is used to horizontally position the lower surface of the frustoconical portion 282. Further, a first suction hole 24c for supplying a vacuum to the vacuum chuck 281a is formed at the center of the bottom surface of the large-diameter recess 24b. Further, a positioning recess 24d for positioning the holding table 28 with respect to the rotating shaft 24a in its rotational direction is formed on the upper surface of the rotating shaft 24a at a position near the large-diameter recess 24b. Further, a second suction hole 24e for holding the holding table 28 on the upper surface of the rotating shaft 24a under suction is also formed on the upper surface of the rotating shaft 24a at a position near the large-diameter recess 24b.

FIG. 3 is a vertical sectional view depicting a condition where the holding table 28 is mounted on the support member 24. As depicted in FIG. 3, a large-diameter projection 282b is formed on the lower surface of the frustoconical portion 282 of the holding table 28. The large-diameter projection 282b has substantially the same shape as that of the large-diameter recess 24b and has a size slightly smaller than that of the large-diameter recess 24b. Accordingly, the large-diameter projection 282b formed at the center of the lower surface of the frustoconical portion 282 of the holding table 28 is inserted in the large-diameter recess 24b formed at the center of the upper surface of the rotating shaft 24a. Further, a positioning projection 282c is also formed on the lower surface of the frustonical portion 282. The positioning projection 282c has substantially the same shape as that of the positioning recess 24d and has a size slightly smaller than that of the positioning recess 24d. Accordingly, the positioning projection 282c formed on the lower surface of the frustoconial portion 282 of the holding table 28 is inserted in the positioning recess 24d formed on the upper surface of the rotating shaft 24a. With this configuration, the holding table 28 can be accurately centered with respect to the support member 24 and can also be accurately positioned with respect to the support member 24 in the rotational direction.

The first suction hole 24c and the second suction hole 24e described above are connected to suction means (not depicted) for producing a vacuum. The first suction hole 24c is connected to a space S defined between the lower surface of the vacuum chuck 281a and the upper surface of the wafer holding portion 281 (the bottom surface of a circular recess for receiving the vacuum chuck 281a), so that the vacuum produced by the suction means is applied through the first suction hole 24c to the upper surface of the vacuum chuck 281a, thereby holding the wafer under suction. Further, by supplying the vacuum to the second suction hole 24e, the lower surface of the frustoconical portion 282 of the holding table 28 is attracted under suction to the upper surface of the rotating shaft 24a, thereby fixing the holding table 28 to the support member 24.

As depicted in FIG. 3, a pulse motor M functioning as driving means rotating the rotating shaft 24a is provided in the support member 24, so that the holding table 28 can be rotated by a desired angle with respect to the support member 24. Although not depicted, each of the X moving mechanism 31, the Y moving mechanism 32, and the holding table 28 is provided with position detecting means including a known linear scale, so that the X position, Y position, and rotational position of the holding table 28 can be accurately detected. Information on the X position, Y position, and rotational position detected above is transmitted to the control unit. Then, the control unit outputs control signals to operate the pulse motor 33 of the X moving mechanism 31, the pulse motor 35 of the Y moving mechanism 32, and the pulse motor M provided in the support member 24, thereby moving the holding table 28 to an arbitrary X coordinate position, Y coordinate position, and rotational position. The operation of the processing apparatus 1 configured above in this preferred embodiment will now be described.

Figure 4:
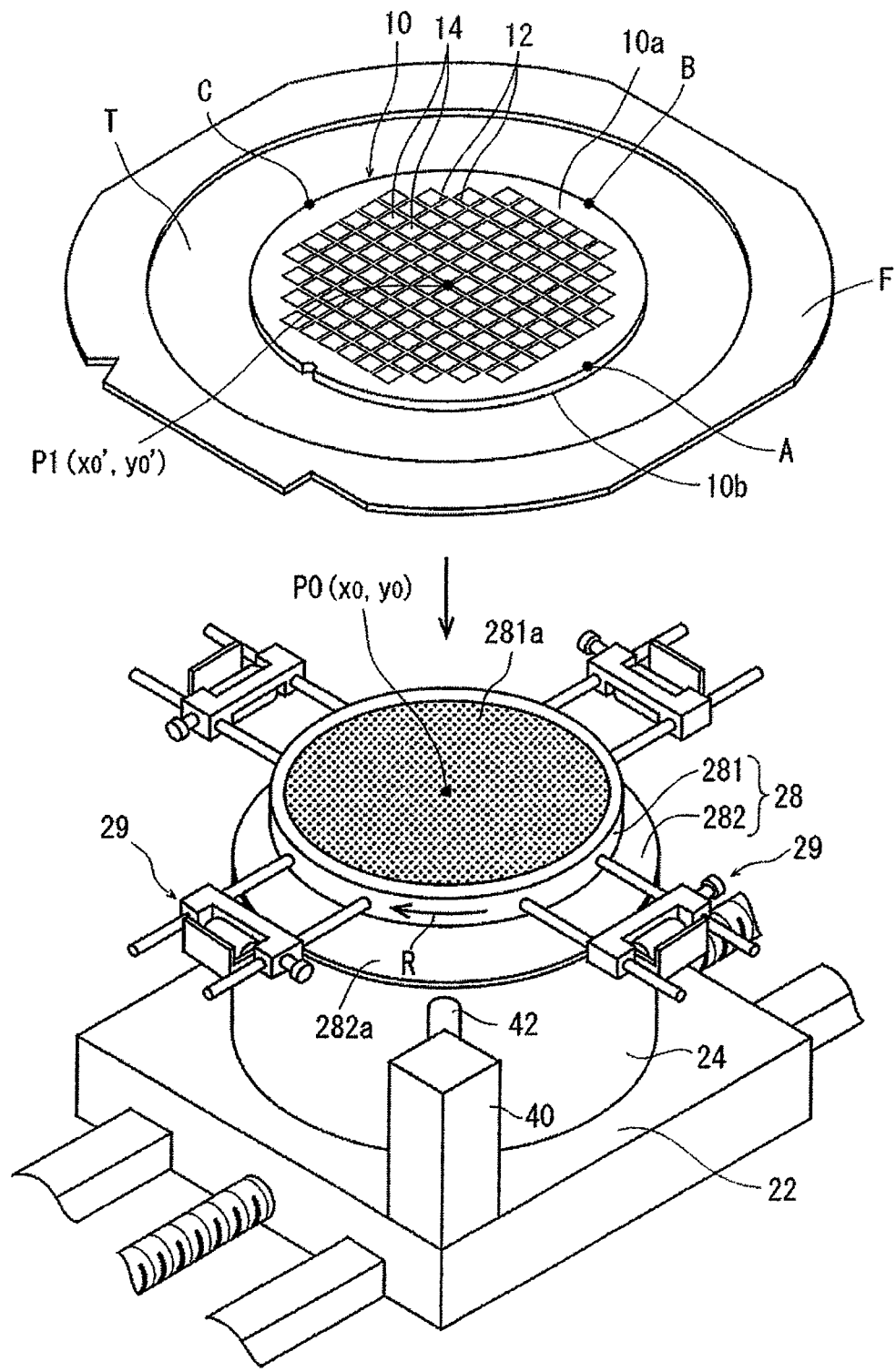
FIG. 4 is a perspective view depicting a manner of placing a wafer on the holding table.
Figure 5:
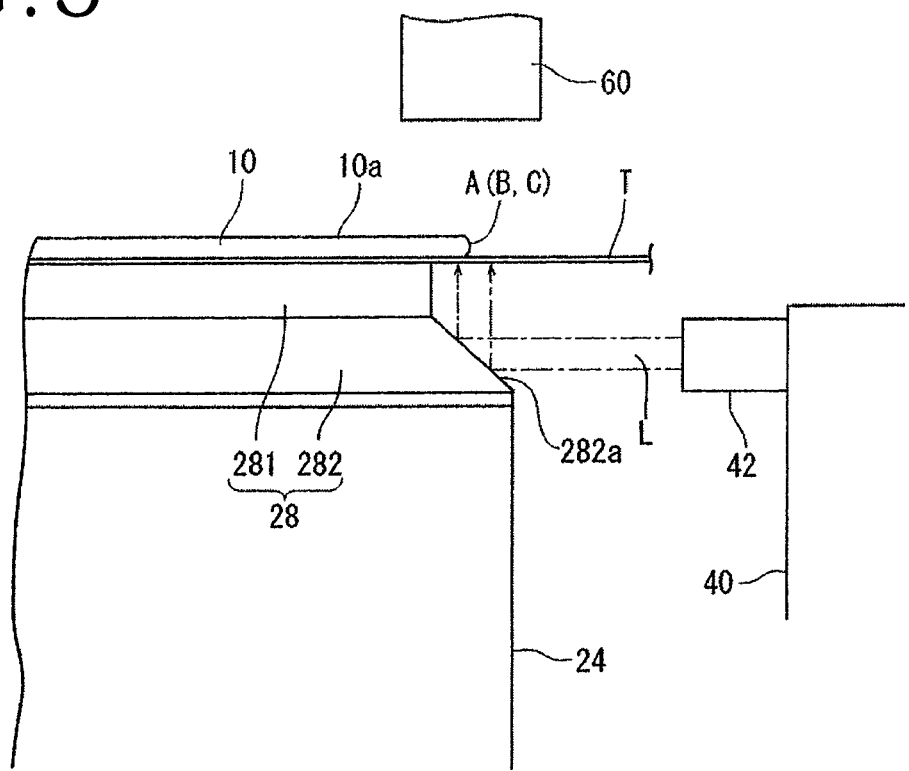
FIG. 5 is a side view depicting a manner of applying light to the side surface of a frustoconical portion of the holding table to thereby image the outer circumference of the wafer in an imaging unit.

FIG. 4 is an enlarged perspective view depicting the Y movable plate 22, the support member 24, and the holding table 28 constituting the holding unit 20 provided in the laser processing apparatus 1 and also depicting a wafer 10 to be held on the holding table 28. FIG. 5 is a side view depicting a condition where the wafer 10 is held on the holding table 28. As depicted in FIGS. 4 and 5, a column 40 is fixed to the upper surface of the Y movable plate 22 at a position adjacent to the support member 24. The column 40 is provided with a light emitting member 42 for applying light L toward the holding table 28. The light emitting member 42 is configured by an LED, for example. The light emitting member 42 is set at the same height as that of the side surface 282a of the frustoconical portion 282 of the holding table 28. The light L is horizontally applied from the light emitting member 42 to the side surface 282a of the frustoconical portion 282. Preferably, the side surface 282a of the frustoconical portion 282 is a mirror surface.

As depicted in FIG. 4, the wafer 10 is a circular workpiece. The wafer 10 has a front side 10a (upper surface) and a back side 10b (lower surface) opposite to the front side 10a. The backside 10b of the wafer 10 is attached to a circular dicing tape T at a central portion thereof. An annular frame F is attached to a peripheral portion of the dicing tape T. Accordingly, the wafer 10 is supported through the dicing tape T to the annular frame F. A plurality of crossing division lines 12 are formed on the front side 10a of the wafer 10 to thereby define a plurality of rectangular separate regions where a plurality of devices 14 are respectively formed. As depicted in FIG. 5, the diameter of the wafer holding portion 281 of the holding tale 28 is set smaller than the diameter of the wafer 10. Accordingly, the outer circumference of the wafer 10 projects radially outward from the outer circumference of the wafer holding portion 281. Further, the diameter of the lower surface of the frustoconical portion 282 of the holding table 28 is set larger than the diameter of the wafer 10 held by the wafer holding portion 281. In FIG. 4, P0 (x0, y0) denotes the center coordinates of the wafer holding portion 281 of the holding table 28, and P1 (x0', y0') denotes the center coordinates of the wafer 10 held on the wafer holding portion 281. The center coordinates P0 (x0, y0) of the wafer holding portion 281 are always managed by the control unit (not depicted) according to the information from the linear scales of the position detecting means mentioned above.

After the wafer 10 is placed on the holding table 28, the annular frame F is fixed by the clamps 29. Thereafter, the suction means (not depicted) is operated to hold the wafer 10 on the holding table 28 under suction. Thereafter, the moving mechanism 30 is operated by the control unit (not depicted) to move the holding table 28 to a predetermined position as depicted in FIG. 5. More specifically, the position where the light L emitted from the light emitting member 42 fixed to the column 40 is to be applied to the side surface 282a of the frustoconical portion 282 is moved to a position directly below the imaging unit 60 as depicted in FIG. 5. In other words, the holding table 28 is moved to the position where the outer circumference of the wafer 10 can be imaged by the imaging unit 60 from the upper side of the holding table 28.

Thus, the light applying position on the side surface 282a of the frustoconical portion 282 is set directly below the imaging unit 60. Thereafter, the light L is applied from the light emitting member 42 to the side surface 282a of the frustoconical portion 282. The light L applied to the side surface 282a is reflected on the side surface 282a to upward change the traveling direction of the light L by 90 degrees. That is, the light L reflected on the side surface 282a travels toward the imaging unit 60, in which a predetermined peripheral edge of the wafer 10 is projected by the light L to the imaging unit 60. At this time, the predetermined peripheral edge of the wafer 10 is set as a first peripheral edge A as depicted in FIG. 4, and this first peripheral edge A is imaged by the imaging unit 60. Information obtained by the imaging unit 60 is transmitted to the control unit (not depicted), and the control unit determines the coordinates A (x1, y1) of the first peripheral edge A. The coordinates A (x1, y1) determined are stored into the RAM of the control unit (not depicted).

Thereafter, the pulse motor M for rotating the rotating shaft 24a is operated to rotate the holding table 28 by 90 degrees in the direction depicted by an arrow R in FIG. 4. Thereafter, the light L is applied from the light emitting member 42 to the side surface 282a of the frustoconical portion 282. Accordingly, the light L applied is reflected on the side surface 282a to upward change the traveling direction of the light L by 90 degrees. That is, the light L reflected on the side surface 282a travels toward the imaging unit 60, in which a predetermined peripheral edge of the wafer 10 is projected by the light L to the imaging unit 60. At this time, the predetermined peripheral edge is set as a second peripheral edge B as depicted in FIG. 4, and this second peripheral edge B is imaged by the imaging unit 60. According to an image obtained by the imaging unit 60, the coordinates B (x2, y2) of the second peripheral edge B are determined by the control unit and then stored into the RAM of the control unit (not depicted).

Thereafter, the holding table 28 is further rotated by 90 degrees in the direction R and the light L is next applied from the light emitting member 42 to the side surface 282a of the frustoconical portion 282. Accordingly, the light L applied is reflected on the side surface 282a to travel toward the imaging unit 60, in which a predetermined peripheral edge of the wafer 10 is projected by the light to the imaging unit 60. At this time, the predetermined peripheral edge is set as a third peripheral edge C as depicted in FIG. 4, and this third peripheral edge C is imaged by the imaging unit 60. According to an image obtained by the imaging unit 60, the coordinates C (x3, y3) of the third peripheral edge C are determined by the control unit and then stored into the RAM of the control unit (not depicted).

In the condition where the first peripheral edge A is imaged, the distance between the center coordinates P0 (x0,y0) of the holding table 28 and the center coordinates P1 (x0', y0') of the wafer 10 is defined as a deviation (r) between the center of the holding table 28 and the center of the wafer 10. In the case that the angle formed between the X axis and the line connecting the center of the holding table 28 and the center of the wafer 10 is defined as θ, x0' and y0' of the center coordinates P1 (x0', y0') of the wafer 10 are calculated below.

$$x0' = x0 + r \cos \theta \tag{1}$$

$$y0' = y0 + r \sin \theta \tag{2}$$

Further, the distance between the coordinates A (x1, y1) of the first peripheral edge A and the center coordinates P1 (x0', y0') of the wafer 10 is defined as the radius (R) of the wafer 10. Assuming a right-angled triangle having a line connecting the coordinates A of the first peripheral edge A and the center coordinates P1 of the wafer 10 as an oblique side, the following equation on the radius (R) holds.

$$R^2 = [x1 - (x0 + r \cos \theta)]^2 + [y1 - (y0 + r \sin \theta)]^2 \tag{3}$$

Further, in the condition where the holding table 28 is further rotated by 90 degrees (π/2) to image the second peripheral edge B, the distance between the coordinates B (x2, y2) of the second peripheral edge B and the center coordinates P1 (x0', y0') of the wafer 10 is also defined as the radius (R) of the wafer 10. Similarly, in the condition where the holding tale 28 is further rotated by 90 degrees (π/2) to image the third peripheral edge C, the distance between the coordinates C (x3, y3) of the third peripheral edge C and the center coordinates P1 (x0', Y0') of the wafer 10 is also defined as the radius (R) of the wafer 10. Accordingly, the following equations also hold.

$$R^2 = [x2 - (x0 + r \cos(\theta + \pi/2))]^2 + [y2 - [y0 + r \sin(\theta + \pi/2))]^2 \tag{4}$$

$$R^2 = [x3 - (x0 + r \cos(\theta + \pi))]^2 + [y3 - [y0 + r \sin(\theta + \pi))]^2 \tag{5}$$

From Eqs. (1) to (5), the center coordinates P1 (x0', y0') of the wafer 10 in imaging the first peripheral edge A can be calculated, so that the deviation (r) of the center coordinates P1 (x0', y0') of the wafer 10 from the center coordinates P0 (x0, y0) of the holding table 28 can be accurately grasped. A method for calculating the center coordinates P1 of the wafer 10 is described in Japanese Patent Laid-open No. 2014-060224 and the details of this method will be omitted herein. After detecting the center coordinates P1 of the wafer 10 and the deviation of the center coordinates P1 of the wafer 10 from the center coordinates P0 of the holding table 28, information on this deviation is stored as correction information into the control unit. This correction information is used in processing the wafer 10 by using the laser processing apparatus 1. Accordingly, even when the center of the wafer 10 held on the holding table 28 is deviated from the center of the holding table 28, laser processing can be accurately performed along each division line 12 of the wafer 10 by suitably moving the holding table 28.

Even in the case that the diameter of the holding table 28 is smaller than the diameter of the support member 24 as in this preferred embodiment, the outer circumference of the wafer 10 can be imaged by reflecting the light L on the side surface 282a of the frustoconical portion 282 of the holding table 28. Accordingly, a predetermined peripheral edge on the outer circumference of the wafer 10 can be well imaged, so that the deviation of the center coordinates P1 of the wafer 10 from the center coordinates P0 of the holding table 28 can be detected. Further, it is unnecessary to provide a light emitting member on the support member 24 or on the holding table 28, so that a production cost can be suppressed.

The present invention is applicable not only to the general wafer 10 depicted in FIG. 5, but also to any other circular work pieces. For example, the present invention is applicable also to a circular wafer having a configuration such that a device area is formed on the front side of the wafer in a central portion and a peripheral marginal area is formed around the device area, in which a circular recess is formed on the back side of the wafer in a portion corresponding to the device area by grinding, so that a ring-shaped reinforcing portion is formed on the back side of the wafer so as to surround this circular recess. By processing this circular wafer having the ring-shaped reinforcing portion in a laser processing apparatus, the wafer is divided into individual device chips. Also in this case, a similar effect can be obtained. This case will now be described in more detail with reference to FIG. 6.

Figure 6:
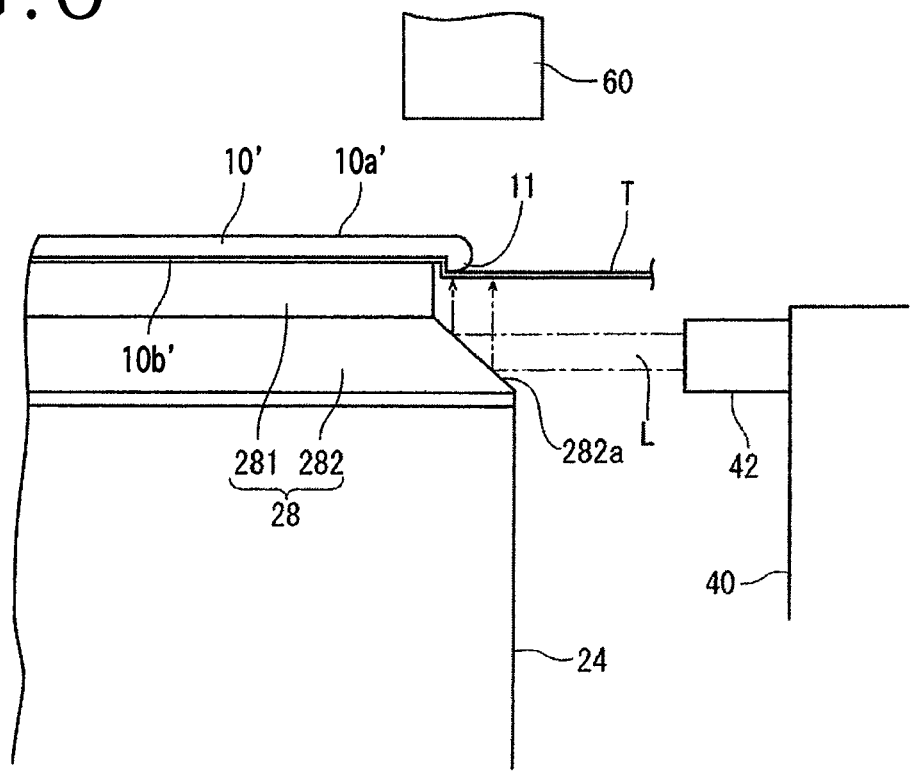
FIG. 6 is a side view similar to FIG. 5, depicting another case that a wafer having a reinforcing portion along the outer circumference of the wafer is imaged by an imaging unit.

FIG. 6 is a side view depicting a condition where a wafer 10' having a front side 10'a and a back side 10'b is held under suction on the wafer holding portion 281 of the holding table 28, in which a ring-shaped reinforcing portion 11 is formed on the back side 10'b of the wafer 10' along the outer circumference thereof, and the wafer 10' is supported through the dicing tape T to the annular frame F (not depicted in FIG.6).

As depicted in FIG. 6, the upper surface of the wafer holding portion 281 has a diameter smaller than that of the wafer 10', so that the ring-shaped reinforcing portion 11 of the wafer 10' is projected (overhung) from the outer circumference of the upper surface of the wafer holding portion 281. Further, the lower surface (base) of the frustoconical portion 282 has a diameter larger than that of the wafer 10' held by the wafer holding portion 282a. As similar to the above preferred embodiment, the light L applied from the light emitting member 42 fixed to the column 40 is reflected on the side surface 282a of the frustoconical portion 282, so that a peripheral edge of the wafer 10' is projected by the light L reflected on the side surface 282a and then imaged by the imaging unit 60. As mentioned above, the diameter of the wafer holding portion 281 of the holding table 28 is set smaller than the diameter of the wafer 10', which is a workpiece to be held on the wafer holding portion 281. Accordingly, the ring-shaped reinforcing portion 11 formed along the outer circumference of the wafer 10' is projected radially outside the wafer holding portion 281. That is, in holding the wafer 10' on the wafer holding portion 281, the reinforcing portion 11 does not interfere with the wafer holding portion 281, so that the front side 10'a of the wafer 10' held on the wafer holding portion 281 becomes horizontal. Accordingly, the deviation of the center of the wafer 10' from the center of the holding table 28 can be well detected.

Figure 7:
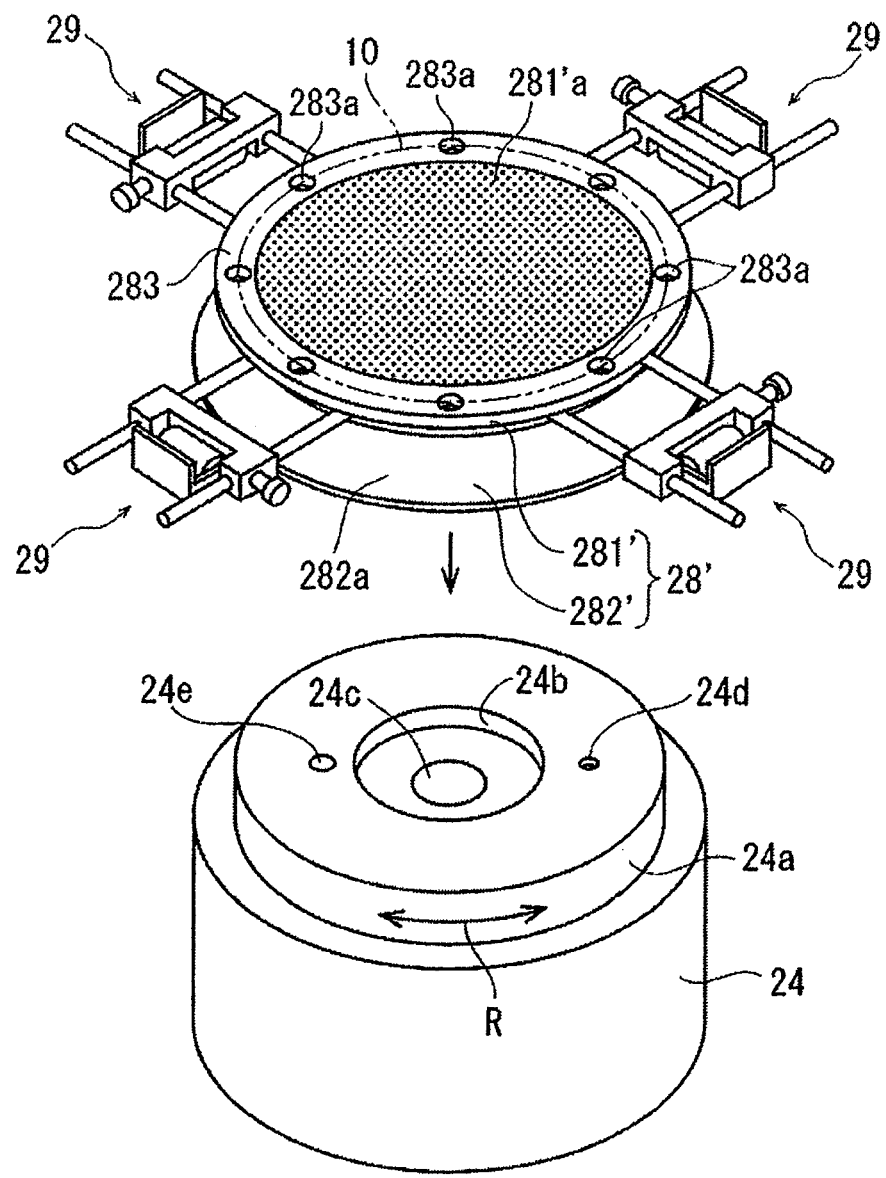
FIG. 7 is a perspective view depicting a modification of the holding unit.

The present invention is not limited to the above preferred embodiment, but various modifications may be made. FIG. 7 depicts a holding table 28' according to a modification of the above preferred embodiment. In FIG. 7, reference numeral 24 denotes a support member identical with that depicted in FIGS. 2 and 3. Accordingly, the description of the support member 24 depicted in FIG. 7 will be omitted herein.

The holding table 28' includes a wafer holding portion 281' for holding the wafer 10 which is a workpiece and a frustoconical portion 282' having an upper surface for supporting the wafer holding portion 281'. The wafer holding portion 281' has an upper surface for holding the wafer 10. The upper surface of the wafer holding portion 281' is provided with a circular vacuum chuck 281'a formed of a porous material allowing the pass of air. The vacuum chuck 281'a has a substantially horizontal upper surface for holding the wafer 10 under suction. Furthermore, a ring-shaped auxiliary table 283 is provided along the outer circumference of the wafer holding portion 281'of the holding table 28' so as to surround the vacuum chuck 281'a. The auxiliary table 283 functions to support the outer circumference of the wafer 10 held on the wafer holding portion 281'. The frustoconical portion 282' has the same configuration as that of the frustoconical portion 282 depicted in FIGS. 2 and 3. Accordingly, the description of the frustoconical portion 282' will be omitted herein.

The auxiliary table 283 has at least three (e.g., eight in this modification) holes 283a for passing the light L reflected on the side surface 282'a of the frustoconical portion 282' and applying the reflected light L to the peripheral edge (depicted by a phantom line in FIG. 7) of the wafer 10. As depicted in FIG. 7, the plural holes 283a of the auxiliary table 283 are arranged on a circle coinciding with the outer circumference of the wafer 10 held on the wafer holding portion 281'. In the case of stepwise rotating the holding table 28' by 90 degrees to image at least three peripheral edges of the wafer 10 as similarly to the above preferred embodiment, the holes 283a of the auxiliary table 283 are formed at at least three positions. Preferably, the holes 283a are formed at four positions equally spaced or at eight positions equally spaced.

As described above, the auxiliary table 283 having the plural holes 283a is provided so as to surround the wafer holding portion 281'. Accordingly, even when the diameter of the wafer holding portion 281' is smaller than the diameter of the wafer 10, the outer circumference of the wafer 10 held on the wafer holding portion 281' can be supported on the auxiliary table 283, thereby preventing possible deformation of the wafer 10 at a peripheral portion thereof. Further, since the auxiliary table 283 has the at least three or more holes 283a, the outer circumference of the wafer 10 is partially exposed to the holes 283a. Accordingly, the light L reflected on the side surface 282'a of the frustoconical portion 282'is allowed to pass through the holes 283a and then project the outer circumference of the wafer 10. That is, a predetermined peripheral edge of the wafer 10 can be imaged by the imaging unit 60 to determine the coordinates of the predetermined peripheral edge. Accordingly, the coordinates of the center of the wafer 10 can be detected.

While the side surface 282*a* of the frustoconical portion 282 of the holding table 28 is inclined at 45 degrees with respect to the lower surface of the frustoconical portion 282 in this preferred embodiment, the angle of inclination of the side surface 282*a* may be any angles other than 45 degrees. In this case, the angle of application of the light L toward the side surface 282*a* (i.e., the angle of incidence of the light L on the side surface 282*a*) is preferably suitably adjusted according to the angle of inclination of the side surface 282*a* so that the light L applied from the light emitting member 42 is reflected on the side surface 282*a* to image the peripheral edge of the wafer 10 in the imaging unit 60.

While the wafer 10 is stepwise rotated by 90 degrees to detect the coordinates of the first peripheral edge A, the second peripheral edge B, and the third peripheral edge C, thereby detecting the center coordinates P1 (x0', y0') of the wafer 10 in this preferred embodiment, this method is merely illustrative and any other methods may be used to detect the coordinates of the center of the wafer 10. For example, after detecting the coordinates of any arbitrary three peripheral edges of the wafer 10, straight lines connecting these three peripheral edges may be calculated and a perpendicular bisector of each straight line may be determined. Accordingly, the intersection of these perpendicular bisectors may be determined as the center P1 of the wafer 10.

Further, while the present invention is applied to a laser processing apparatus in the above preferred embodiment, the present invention may be applied to a dicing apparatus using a cutting blade, for example. The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
a holding unit holding a circular wafer;
an imaging unit imaging the outer circumference of said wafer held by said holding unit from the upper side of said holding unit; and
a light emitting member provided separately from said holding unit;
said holding unit including a holding table for holding said wafer under suction in a condition where the outer circumference of said wafer projects from the outer circumference of said holding table, a support member for supporting said holding table, and driving means rotating said holding table;
said holding table including a frustoconical portion and a wafer holding portion formed on the upper surface of said frustoconical portion for holding said wafer, said wafer holding portion having a diameter smaller than that of said wafer;
the lower surface of said frustoconical portion having a diameter larger than that of said wafer, wherein
light is applied from said light emitting member to the side surface of said frustoconical portion and next reflected on the side surface of said frustoconical portion, and the light reflected is next applied to the outer circumference of said wafer held on said wafer holding portion of said holding table to thereby image the outer circumference of said wafer in said imaging unit.

2. The processing apparatus according to claim 1, wherein said holding unit further includes an auxiliary table formed along the outer circumference of said holding table for supporting the outer circumference of said wafer held on said holding table;
said auxiliary table having at least three holes for passing the light reflected on the side surface of said frustoconical portion, so that the light passed through said holes is applied to the outer circumference of said wafer.

3. The processing apparatus according to claim 1, wherein the side surface of said frustoconical portion is inclined at an angle of 45 degrees with respect to the lower surface of said frustoconical portion.

* * * * *